United States Patent

Taniguchi et al.

[15] 3,657,575

[45] Apr. 18, 1972

[54] THRESHOLD VOLTAGE COMPENSATING CIRCUITS FOR FETS

[72] Inventors: Kenji Taniguchi, Kodaira; Ichiro Imaizumi; Atsuo Hotta, both of Kokubunji, all of Japan

[73] Assignee: Hitachi, Ltd., Tokyo, Japan

[22] Filed: Mar. 15, 1971

[21] Appl. No.: 124,183

[30] Foreign Application Priority Data

Mar. 13, 1970 Japan..................................45/20882

[52] U.S. Cl...............................307/304, 307/235, 307/251, 307/264, 307/297

[51] Int. Cl...........................................................H03k 17/60

[58] Field of Search..................307/208, 235, 251, 264, 297, 307/304

[56] References Cited

UNITED STATES PATENTS

| | | | |
|---|---|---|---|
| 3,303,413 | 2/1967 | Warner, Jr. et al. | ...............307/297 X |
| 3,450,896 | 6/1969 | Taniguchi et al. | .................307/208 X |

OTHER PUBLICATIONS

Baitinger et al., Constant-Current Source Network, IBM Technical Disclosure Bulletin, February 1971, p. 2516.

*Primary Examiner*—Stanley T. Krawczewicz
*Attorney*—Craig, Antonelli & Hill

[57] ABSTRACT

A field effect semiconductor device including a plurality of field effect semiconductor elements formed on a common substrate and a compensating circuit for controlling the threshold voltage of said transistors by comparing the threshold voltage of one transistor to a reference voltage and generating a backward bias control voltage across a PN-junction of the one transistor between the source thereof, which is connected to the source of at least one of the other transistors, and the common substrate.

7 Claims, 5 Drawing Figures

INVENTORS
KENJI TANIGUCHI, ICHIRO IMAIZUMI AND ATSUO HOTTA
BY
Craig, Antonelli, Stewart & Hill
ATTORNEYS INVENTORS
KENJI TANIGUCHI, ICHIRO IMAIZUMI
AND ATSUO HOTTA
BY
Craig, Antonelli, Stewart & Hill
ATTORNEYS

PATENTED APR 18 1972 3,657,575

INVENTORS
KENJI TANIGUCHI, ICHIRO IMAIZUMI
BY AND ATSUO HOTTA
Craig, Antonelli, Stewart & Hill
ATTORNEYS

THRESHOLD VOLTAGE COMPENSATING CIRCUITS FOR FETS

BACKGROUND OF THE INVENTION

This invention relates to a field effect semiconductor device having a plurality of field effect semiconductor elements sharing a common semiconductor substrate, and more particularly to such a device employing a circuit for compensating or reducing variation in the threshold voltages of the elements.

The recent development in integrated circuit technology is accelerating the use of integrated circuits in all types of electric or electronic equipment, such as electronic computers, various data processing systems, measuring circuits and logic circuits for general instruments.

Metal oxide semiconductor type field effect transistors, hereinafter referred to as MOS transistors, are in great use in integrated memory circuits and integrated logic circuits, since they provide for simple fabrication and yet make possible a high packing density.

The MOS transistor, generally, is operated on majority carriers, in contrast to the bipolar transistor, which is generally operated on minority carriers. It is known that the MOS transistor is theoretically less affected by stored charges and is inherently capable of having a higher logical speed of operation than that of the bipolar transistor. The MOS transistor has two regions in a semiconductor substrate, namely source and drain regions which are disposed at a certain distance from each other, and an insulated gate electrode which is disposed above the semiconductor substrate at a channel defined by the source and drain regions by way of an insulating film, such as a metal oxide film. A current flowing from the drain to the source of an MOS transistor is ON/OFF controlled by a voltage supplied to the insulated gate electrode. The ON/OFF states of the drain current represent "0" and "1" logic states for switching functions necessary for the logic circuits.

The voltage applied to the gate electrode in the boundary between the ON and OFF states in the drain current is called the threshold voltage $V_{TH}$. This threshold voltage differs according to the thickness and nature of the insulating film used, fluctuation in the characteristics of circuit elements inherent in the production of the device, and temperature changes. This gives rise to problems as to how the threshold voltages of MOS transistors can be stabilized. To stabilize the threshold voltage, complex arrangements have hitherto been required.

The fluctuation in the threshold voltages in an MOS transistor will first be considered and then various embodiments of the invention will be described in conjunction with the accompanying drawings, in which.

DETAILED DESCRIPTION OF THE INVENTION

Figure 1:
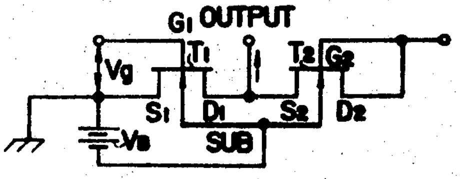
FIG. 1 PRIOR ART
FIG. 1 is a diagram showing an explanatory inverter circuit of conventional configuration.

Referring now to FIG. 1, there is illustrated an inverter circuit comprising MOS transistors $T_1$ and $T_2$. The common substrate sub is of the P-type and an input signal or input voltage $V_g$ is supplied between the source $S_1$ and the insulated gate $G_1$ of the transistor $T_1$. The source $S_2$ of the transistor $T_2$ is connected with the drain $D_1$ of the transistor $T_1$ from which an output is derived. The insulated gate $G_2$ and the drain $D_2$ of the transistor $T_2$ are connected together to an operation voltage supply. The semiconductor substrate is shared by the transistors $T_1$ and $T_2$, as illustrated in FIG. 1. This substrate is backwardly biased with a backward bias voltage $V_B$ with respect to the source $S_1$ of the transistor $T_1$, which is grounded.

Figure 2:
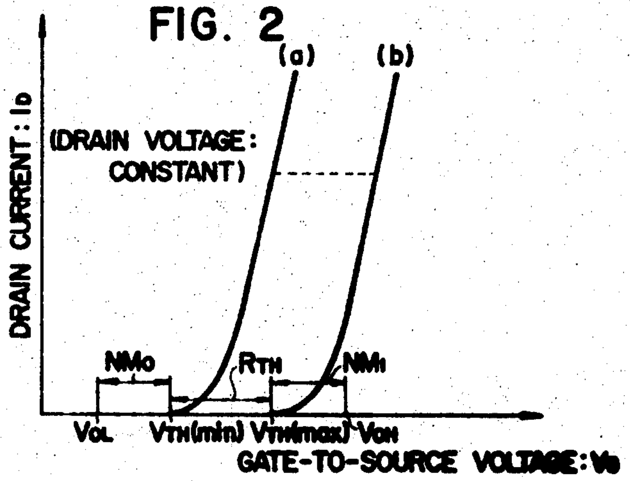
FIG. 2 shows the input-to-output characteristic of an MOS transistor.

FIG. 2 shows the possible variation in the threshold voltages of field effect transistors which are formed simultaneously in a common semiconductor substrate. As apparent from FIG. 2, the threshold voltages of the respective field effect transistors may be distributed, and the lowermost and the highermost threshold voltage $V_{TH(min)}$ and $V_{TH(max)}$ only are illustrated. Curves *a* and *b* represent drain current v. input voltage characteristics of both extreme transistors under a constant drain voltage. To secure an exact switching operation, the regions for noise margins $NM_0$ and $NM_1$ must be reserved below the lowermost and above the highermost threshold voltage, respectively, in addition to reservation of a threshold region $R_{TH}$ wherein other threshold voltages (not illustrated) are included.

If the threshold voltages of field effect transistors sharing a semiconductor substrate in common are so widely distributed that the threshold region $R_{TH}$ which is irrelevant to the logic operation is extremely expanded, the amplitude of the input signal $V_{OL}$–$V_{OH}$ should be increased since it is necessary for securing exact logical operation between the ON and OFF states of all the transistors. This requires an increased power consumption for the input signal.

In a semiconductor device employing commonly formed MOS transistors, the variation in the threshold voltages thereof is ten to twenty times larger than the variation in the base-to-emitter threshold voltages of bipolar transistors. This is why it has been difficult to design a more efficient logic circuit with MOS transistors than by using bipolar transistors.

Accordingly, a general object of the present invention is to provide a field effect semiconductor device employing a plurality of insulated gate field effect semiconductor elements and having particularly a circuit capable of compensating or reducing the variation in the threshold voltages of the elements.

Figure 3:
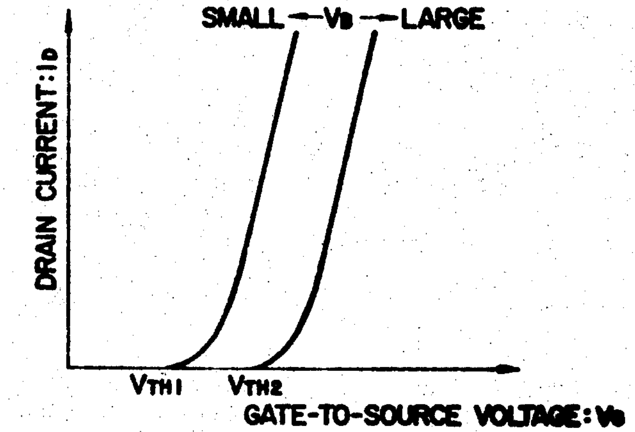
FIG. 3 shows the input-to-output characteristic of an MOS transistor used in the circuit of FIG. 1, wherein a backward bias voltage applied between the source region and the common substrate is changed as a parameter.

In order to attain the above object, the present invention utilizes a principle that the threshold voltage of any one of the field effect transistors can be varied largely by change in the backward bias voltage applied between the source and the substrate of the transistor. More specifically described, the threshold voltage of the MOS transistor $T_1$ in the circuit of FIG. 1 is varied from $V_{TH1}$ to $V_{TH2}$ and vice versa with increase and decrease, respectively, of the voltage $V_B$ applied backwardly across a pn junction between the source and the common substrate of the transistor, as seen in FIG. 3.

Further, according to the present invention, the threshold voltage of at least one of the field effect transistors in a semiconductor integrated circuit (IC) or a large scale integration (LSI) can be compared with a predetermined specific reference voltage representing a standard threshold value to which the IC or the LSI is stabilized, and the backward bias voltage is changed in response to the result of the comparison so that the bias voltage forces the one transistor under comparison to vary its threshold voltage to decrease the difference from the reference voltage.

Figure 4:
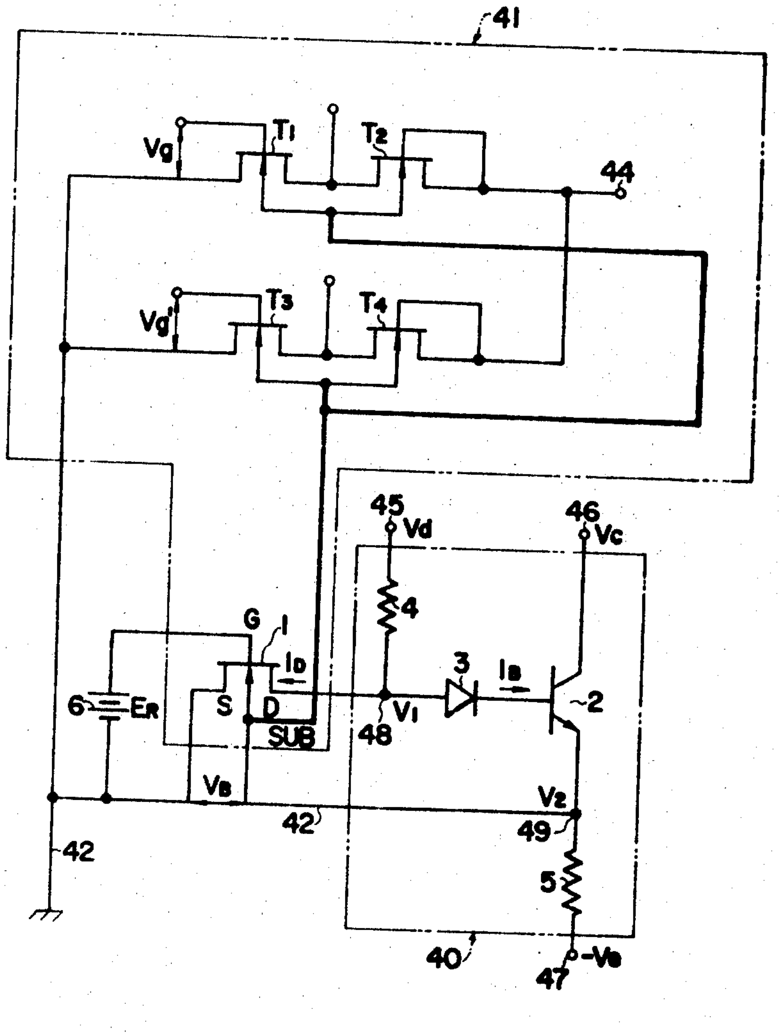
FIGS. 4 and 5 are circuit diagrams illustrating embodiments of the present invention.

To best realize the aim of the invention, an explanatory circuit device, as an embodiment of the invention, is shown in FIG. 4, which comprises; an MOS transistor 1 subjected to detection of its threshold voltage; an external DC source 6 for supplying a specific reference voltage $E_R$ between the insulated gate G and the source region S of the transistor 1; control voltage generating means 40 comprising a bipolar transistor 2, a diode 3 and resistors 4 and 5 for generating a control voltage which is variable in response to the value of the threshold voltage of the transistor 1, the value of the control voltage depending on whether the threshold voltage exceeds the reference voltage $E_R$ or not; and means 42 for supplying the control voltage from said control voltage generating means between the substrate SUB and the source region S of the transistor 1.

The reference numeral 46 denotes a terminal at which an operating voltage $V_c$ is applied; 45 denotes a terminal at which a positive operating voltage $V_d$ is applied; and 47 denotes a terminal at which a negative operating voltage $-V_e$ is applied.

In the circuit of FIG. 4, the substrate is of the P-type and the reference numeral 41 denotes a semiconductor chip incorporating in common the MOS transistors $T_1$, $T_2$, $T_3$ and $T_4$ as well as the MOS transistor 1, which are formed by IC techniques.

As apparent from FIG. 4, two inverter circuits are formed in the semiconductor chip 41, wherein the transistors $T_1$ and $T_2$ forming a first inverter circuit and the transistors $T_3$ and $T_4$ forming second inverter circuit, both of which are similar to the circuit of FIG. 1. The operating voltage for the two inverter circuits is applied to the terminal 44 and is supplied through respective load transistors $T_2$ and $T_4$ to the transistors $T_1$ and $T_3$.

The input signals $V_g$ and $V_g'$ for the respective inverter circuits are supplied between the respective insulated gate electrodes of the transistors $T_1$ and $T_3$ and the common substrate, and their outputs are derived from the respective drain regions thereof.

Since the reference voltage $E_R$ is supplied between the insulated gate of the transistor 1 and the common substrate, it is compared with the threshold voltage of the transistor 1. It is assumed that the reference voltage $E_R$ is set so as to be in the middle of the threshold range $R_{TH}$ of the transistors whose threshold voltages are to be stabilized, in this case transistors 1, $T_1$ and $T_3$. The other transistors $T_2$ and $T_4$ are not of concern since they are serving as load resistors. There are, therefore, two conditions wherein the threshold voltage of the transistor 1 is larger or smaller than the reference voltage $E_R$, so that the transistor 1 is rendered either conducting (ON) or non-conducting (OFF) depending on whether or not the threshold voltage of the transistor 1 exceeds the reference voltage.

In case the threshold voltage $V_{TH}$ of the transistor is larger than $E_R$, the transistor 1 becomes non-conducting (OFF), thus the drain current $I_D$ stops flowing, so that the potential $V_2$ at the terminal 49 increases, since only a small base current $I_B$ flows through the resistor 4. The pn junction of the diode 3 and the base-emitter junction of the bipolar transistor 2 are disposed in the forward direction between the terminals 48 and 49. The voltage drop across the resistor 4, whose resistance value is $R_L$, is designated by $I_B \times R_L$. The potential $V_2$ at the point 49 is obtained by subtraction of the forward voltage drop across the pn junction of the diode 3 and the base-emitter junction of the transistor 2 from the potential $V_1$. Namely, the potential $V_2 = V_D - I_B \times R_L$. This voltage $V_2$ is applied between the substrate and the source region of the transistor 1 as a control voltage which is designed to be negative with respect to the ground potential; therefore, the more the control voltage increases, the more the backward bias voltage decreases, so that the difference between the threshold voltage of the transistor 1 and the reference voltage is decreased. Thus, the operating condition of the transistor 1 is stabilized at a slightly conducting state.

Normally, the resistance values of the resistors 4 and 5 and the amplification factor of the bipolar transistor 2 are so determined that the potential $V_2$ should not allow carrier injection to the transistor 1 via the pn junction between the source region and the common substrate.

In case the threshold voltage $V_{TH}$ of the transistor 1 is smaller than the reference voltage $E_R$, the transistor 1 becomes conducting (ON state), and the drain current $I_D$ begins flowing. As a result, a current $I_D + I_B$ flows in the resistor 4. It can be considered that the drain current $I_D$ contributes almost all of the voltage drop in the resistor 4 because the base current $I_B$ of the transistor 2 is negligibly small due to the amplifying function of the transistor in comparison with the drain current $I_D$.

Hence, the potential $V_1$ at the point 48 is designated by $V_D - I_D \times R_L$. The potential $V_2$ at the point 49 is obtained from the substraction of the forward voltage drop in the diode 3 and the transistor 2 from the potential $V_1$. In other words, the potential $V_2$ at the point 49, namely the control voltage, which is applicable to the substrate is changed in accordance with changes in the drain current $I_D$.

For example, when the threshold voltage $V_{TH}$ is lowered below the reference voltage $E_R$ due to a temperature change, the transistor 1 becomes conducting, thus a drain current $I_D$ flows and then the potential $V_1$ decreases. By this means, the potential $V_2$ becomes a large negative value, and the control voltage, namely the backward bias voltage $V_B$, which is applicable to the substrate is increased. As a result, the threshold voltage $V_{TH}$ increases, as shown in FIG. 3, so that the difference between the threshold voltage of the transistor 1 and the reference voltage $E_R$ is decreased.

To prevent the PN-junction between the source region of the transistor 1 and the common substrate from being biased in the forward direction, it is necessary to select the reference voltage $E_R$ to be larger than the threshold voltage $V_{THO}$ when the bias voltage $V_B$ applied to the substrate is zero. In this manner, the threshold voltage is stabilized.

Figure 5:
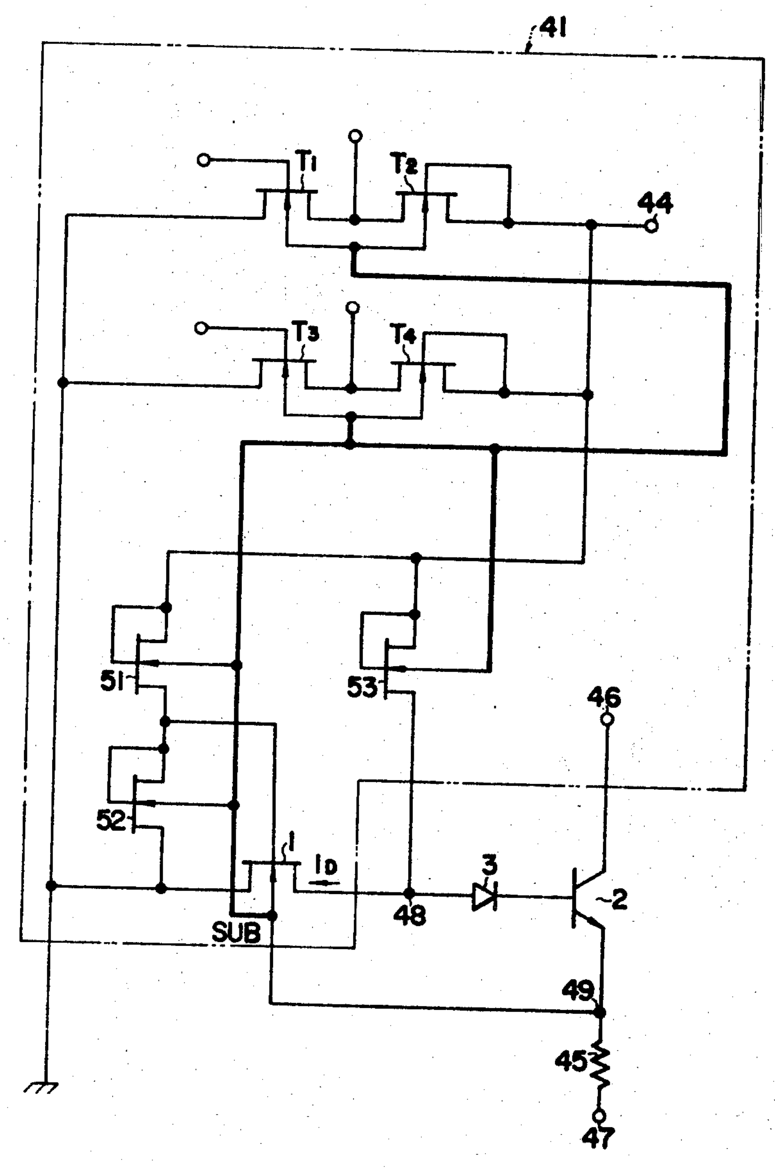

FIG. 5 is a circuit diagram showing another embodiment of the present invention. This embodiment is operated in the same manner as described above, except that the resistor 4 and the reference voltage source 6 are formed by MOS transistors which is formed in the semiconductor clip 41.

More specifically, MOS transistors 51 and 52 are used as resistance elements by providing a short-circuit between their gate and drain electrodes and by connecting them in series with one another, so that the voltage applied to the operation terminal 44 is divided at the resistance ratio of the two resistance elements. The resultant voltage obtained at the junction point 50 between the resistance elements is used as the reference voltage $E_R$. By short-circuiting the drain and gate electrodes, the MOS transistor 53 is used as the resistor 4 of FIG. 4. The resistance values of these elements can be adjusted by suitably changing the number of MOS transistors used.

The foregoing embodiments are described as employing N-channel MOS transistors whose substrate is of the P-type. Instead, P-channel MOS transistors may also be used. In the latter case, the polarity of the MOS transistors must be suitably modified. Also, in the foregoing embodiments, MOS transistors are formed within a semiconductor chip. It is, however, other field effect semiconductor elements, such as metal-insulator-semiconductor elements (MIS) and metal-nitride-semiconductor elements (MNS), may be used for the same purpose and to the same effect. It is evident that the principles of the present invention can be applied to DC amplifier circuits in which a stabilized threshold voltage is normally required.

Generally, variation in the threshold voltages is small in a relatively small region of a semiconductor IC wafer, for example, the region within one chip. In practical applications, therefore, it may be sufficient to arrange a compensating circuit with one MOS element (or MIS element) in said small region so as to permit the threshold voltage of the one element to become nearly equal to the reference voltage.

In a large integrated circuit device, such as an LSI circuit wherein semiconductor integrated circuits are included and widely distributed on a semiconductor substrate, a fairly large variation in the threshold voltages occurs. In such a case, it is preferable to divide the substrate into several separated regions, in each one of which a plurality of field effect elements are included and form an individual device if desired.

According to this invention, as has been described above, a stabilized threshold voltage can be obtained at all times by the use of a simple compensating circuit, and an operably stable field effect semiconductor device can be realized.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What we claim is:

1. A field effect semiconductor device comprising:

a plurality of field effect semiconductor elements sharing a common semiconductor substrate, each of said field effect semiconductor elements having a threshold voltage which slightly differs from the other threshold voltages;

compensating circuit means supplying a backward bias voltage across a PN-junction between the source of one of said field effect semiconductor elements, which acts as a compensating element, and the common substrate for operatingly increasing and decreasing the magnitude of the backward bias voltage in response to conducting and non-conducting of said compensating element, respectively; and means for connecting the source of said compensating element with the source of at least one of the remaining field effect semiconductor elements, thereby reducing the variation in the threshold voltages of said field effect semiconductor elements whose sources are connected together.

2. A field effect semiconductor device according to claim 1, wherein said field effect semiconductor elements are insulated gate type field effect transistors.

3. A field effect semiconductor device according to claim 1, wherein said compensating circuit means comprises:

means for supplying a specific reference voltage between the source and gate of said compensating element; means for detecting the conducting and non-conducting states of said compensating element which are dependent upon, respectively, whether or not said reference voltage exceeds the threshold voltage thereof; and means for generating a backward bias voltage applicable between the source of said compensating element and said common substrate, said bias voltage being increased and decreased, respectively, in dependence on whether or not the reference voltage exceeds the threshold voltage as detected by said detecting means.

4. A field effect semiconductor device according to claim 3, wherein said detecting means includes a bipolar transistor, a diode connecting the base of said bipolar transistor to the drain of said compensating element, and a resistor connecting the drain of said compensating element to a first voltage, the emitter of said bipolar transistor applying said backward bias voltage to the common substrate.

5. A field effect semiconductor device according to claim 4, wherein said field effect semiconductor elements are insulated gate type field effect transistors.

6. A field effect semiconductor device including a plurality of insulated gate type field effect transistors sharing a common semiconductor substrate, each of said field effect transistors having a threshold voltage which slightly differs from the other threshold voltages, and compensating circuit means for reducing the variation in the threshold voltages of said field effect transistors and for stabilizing the threshold voltages to a predetermined specific value comprising:

means providing a reference voltage representing a selected threshold value supplied between the insulated gate of at least one of said field effect transistors, which acts as a compensating element, and the common substrate, so that the compensating element is operated in a conducting or non-conducting state depending upon, respectively, whether or not the reference voltage exceeds the threshold voltage thereof;

means for generating a backward bias voltage supplied across a pn junction between the source of the compensating element and the common substrate and which is increased or decreased in response to, respectively, the conducting or non-conducting state of said compensating element; and means for connecting the source of said compensating element with the source of at least one of the remaining field effect transistors.

7. A field effect semiconductor device according to claim 6, wherein said detecting means includes a bipolar transistor, a diode connecting the base of said bipolar transistor to the drain of said compensating element, and a resistor connecting the drain of said compensating element to a first voltage, the emitter of said bipolar transistor applying said backward bias voltage to the common substrate.

* * * * *